United States Patent [19]

Goldberg et al.

[11] 4,017,266

[45] Apr. 12, 1977

[54] PROCESS FOR MAKING A BRAZED LEAD ELECTRODE, AND PRODUCT THEREOF

[75] Inventors: Monroe B. Goldberg, Huntington Station; William B. Voorhis, Hicksville, both of N.Y.

[73] Assignee: General Instrument Corporation, Clifton, N.J.

[22] Filed: Dec. 19, 1975

[21] Appl. No.: 642,588

Related U.S. Application Data

[63] Continuation-in-part of Ser. No. 463,678, April 24, 1974, Pat. No. 3,930,306.

[52] U.S. Cl. .................................. 428/600; 428/620
[51] Int. Cl.$^2$ ........................................... B32B 15/20
[58] Field of Search ............... 29/198, 199, 195 S; 228/263

[56] References Cited

UNITED STATES PATENTS

| | | | |
|---|---|---|---|
| 1,658,713 | 2/1928 | Fuller | 29/198 |
| 2,427,727 | 9/1947 | Huntley et al. | 29/199 X |
| 3,079,676 | 3/1963 | Myers | 29/198 X |
| 3,455,663 | 7/1969 | Zdanuk | 29/198 |

OTHER PUBLICATIONS

"Brazing Manual" American Welding Society, 2nd edition, N.Y., 1963; pp. 39 and 40.

*Primary Examiner*—L. Dewayne Rutledge
*Assistant Examiner*—E. L. Weise

[57] ABSTRACT

A process for making a brazed lead electrode workpiece, adapted for use as a component of a semiconductor device, comprises the steps of forming a subassembly of a thermally and electrically conductive metal lead member, a copper/silver-based brazing alloy having a wetting point of at least 450° C, and a refractory metal contact member, and then heating the brazing alloy at least to its wetting point.

7 Claims, 3 Drawing Figures

PROCESS FOR MAKING A BRAZED LEAD ELECTRODE, AND PRODUCT THEREOF

CROSS-REFERENCE TO RELATED APPLICATION

This application is a continuation-in-part of U.S. Patent Application Ser. No. 463,678, filed Apr. 24, 1974, now U.S. Pat. No. 3,930,306, dated Jan. 6, 1976

BACKGROUND OF THE INVENTION

The present invention relates to a process for making a workpiece suitable for use in a semiconductor device, and more particularly a workpiece comprising a thermally and electrically conductive lead and a refractory metal contact joined by a high temperature brazing process.

Passivated semiconductor devices generally include a semiconductor body composed substantially of silicon, a layer of passivating material such as glass or plastic disposed about the semiconductor body, and at least one metallic contact extending outwardly from the semiconductor body through the passivating layer as an external contact for connection with the associated circuitry. More specifically, such devices require that the metallic contacts be refractory in nature in order that the coefficients of thermal expansion of the semiconductor body, the passivating layer and the metallic contacts be reasonably matched to avoid breakage during thermal cycling. Molybdenum, tungsten, tantalum and various special alloys are typical of the refractory metals used as such refractory metal contacts; however, since such materials are both expensive and relatively poor conductors of both heat and electric current, the refractory metal contacts are generally joined to good conventional conductors (such as copper, silver or various special alloys) just beyond the passivating layer, the connection between the refractory contact and the other circuitry elements being made by the conventional conductor. In the case of axial-lead-construction semiconductor rectifiers, the connection of the conventional axial lead to the refractory metal contact is accomplished by one of the following two procedures.

In the first procedure, the refractory material is initially plated with a solderable metal such as silver before application of the passivating layer. After the passivating operation, the axial leads are attached to the refractory metal contacts using "soft solder" preforms with melting points typically less than 350° C. Devices containing such connections have the disadvantages commonly associated with soft solder contacts. If extreme temperature control is not exercised in soldering the axial lead to other circuit components, the axial lead may detach from the refractory metal contact as the soft solder heats up. In any case, it has been found that such soft solder joints are subject to thermal fatigue and a resultant short operating life.

In the other procedure, the refractory metal contact is joined to the axial lead by a special welding process known as butt or percussion welding. The joint and the axial lead must thereafter be exposed to all the chemical and heat-treating processes subsequently required to (1) join the semiconductor body to the refractory metal contact, (2) etch the subassembly, and (3) apply and fuse the passivating glass layer. The devices fashioned according to this procedure are not reliable in the first place because a true weld is not possible between the refractory metal of the contact and the conventional conductive metal of the axial lead. Furthermore, the processing operations required to complete the semiconductor device subsequent to formation of the refractory contact/axial lead joint frequently result in a weak and porous joint which will develop high electrical and thermal resistance in time or eventually even fail mechanically and fall off. Experience has shown that butt welded joints have extremely high failure rates when exposed to conditions of high temperature and high humidity, the failure rate rising as high as 50% at conditions of 85° C and 85% relative humidity.

Yet another disadvantage of the process of joining a refractory metal contact to an axial lead by the butt or percussion welding technique is that certain details of the technique are proprietary information, not readily available on the open market. But even if the full details of this technique were generally known, its very nature imposes undesirable constraints on the design of the refractory metal contacts and the axial leads useful therein. In the technique, the axial lead is actually in motion as the weld between the axial lead and the refractory metal contact is made, the parts being brought together to make the electrical contact by rapid advance of the axial lead once the refractory metal contact is in position. The technique requires that each refractory metal contact be inserted into an individual clamp-designed welding electrode in order to control the welding current. Thus, for the automatic rapid positioning essential to mass production, it is necessary that the dimensions of the refractory metal contact adhere to certain rigid specifications, and in particular that it be of a length sufficient to be grasped by the welding electrode clamp. To insure reasonable centering of the axial lead relative to the end of the refractory metal contact, the end of the axial lead must generally be at least 0.5 mm. smaller in diameter than the end of the refractory metal contact. Thus the technique requires a minimum cross-sectional area for the refractory metal contact and additionally imposes a maximum cross-sectional area for the axial lead for a given refractory metal contact. These length and cross-sectional limitations restrict the degree of miniaturization which can be obtained in any semiconductor device ultimately embodying the axial lead/refractory metal contact subassembly.

Accordingly, it is an object of the present invention to provide a process for attaching a thermally and electrically conductive lead to a refractory metal contact using a high temperature brazing process.

It is another object to provide such a process which avoids the aforementioned disadvantages of "soft solder" and "butt welded" joints.

It is also an object to provide such a process wherein the resultant joint is of higher physical strength and lower porosity than a butt-welded joint, withstands a higher temperature than a soft solder joint, and withstands conditions of high temperature and high humidity better than a butt-welded joint.

It is a further object to provide such a process which does not impose limitations on the minimum length or cross-section of the refractory metal contact or on the maximum cross-section of the axial lead for a given refractory metal contact and thus lends itself to unimpeded miniaturization of the semiconductor device embodying the axial lead/refractory metal contact subassembly.

Yet another object is to provide such a process which is adapted to mass production techniques.

Still another object is to provide such a process which utilizes a special preform, is simple and economical to perform, is less expensive than butt welding, and provides a joint superior to those produced by soft solder or butt welding processes.

A final object is to provide a brazed lead electrode workpiece adapted for use in a semiconductor device and comprising a lead member joined to a refractory metal contact by the aforesaid brazing process.

SUMMARY OF THE INVENTION

It has now been found that the above and related objects of the present invention are obtained in a process for attaching a lead member to a contact member by initially providing a lead member formed substantially of a thermally and electrically conductive metal and terminating at one end in a joining surface, and an axially extending contact member formed substantially of a refractory metal and terminating in a joining surface of such refractory metal. The joining surfaces of the members are placed in contact with a copper/silver-based brazing alloy having a wetting point of at least 450° C. The brazing alloy is then heated (preferably in an inert atmosphere at atmospheric pressure) at least to its wetting point for a period of time sufficient to melt the brazing alloy. Thereafter the molten brazing alloy is allowed to cool and solidify in contact with the joining surfaces of the members, thereby to join the contact member and the lead member into a unitary structure.

The refractory metal is selected from the group consisting of tungsten, molybdenum, tantalum, and alloys thereof, and is preferably moybdenum. The conductive metal is selected from the group consisting of silver and copper and alloys thereof, and is preferably copper. A preferred braxing alloy is, on a weight basis, about 80–89% copper, about 5–15% silver and about 4–6% phosphorus, preferably an 80/15/5 alloy. Preferably, the brazing alloy is provided as a preform with joining surfaces of substantially similar configuration and size abutting the joining surfaces of the members.

The present invention provides a brazed lead electrode workpiece adapted for use as a component of a semiconductor device. The workpiece comprises an axially extending contact member formed substantially of a refractory metal and terminating at one end in a joining surface, a lead member formed substantially of a thermally and electrically conductive metal and terminating at one end in a joining surface, and a brazing alloy disposed between and securing together the joining surfaces of the members, thereby to join the members into a unitary structure.

DETAILED DESCRIPTION OF THE PREFERRED EMBODIMENTS

Figure 1:
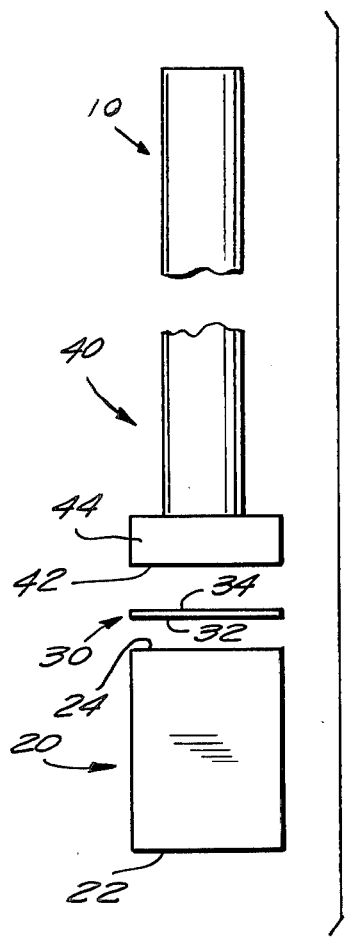
FIG. 1 is a fragmentary exploded plan view of a workpiece according to the present invention.
Figure 2:
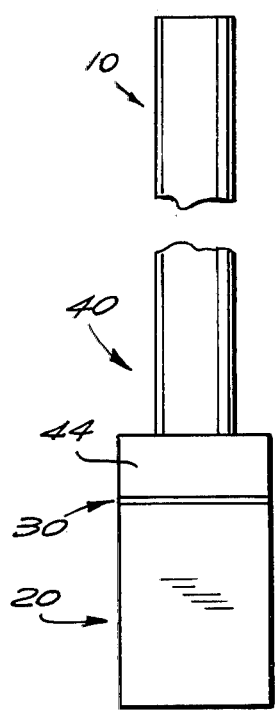
FIG. 2 is a fragmentary plan view of workpiece of FIG. 1.
Figure 3:
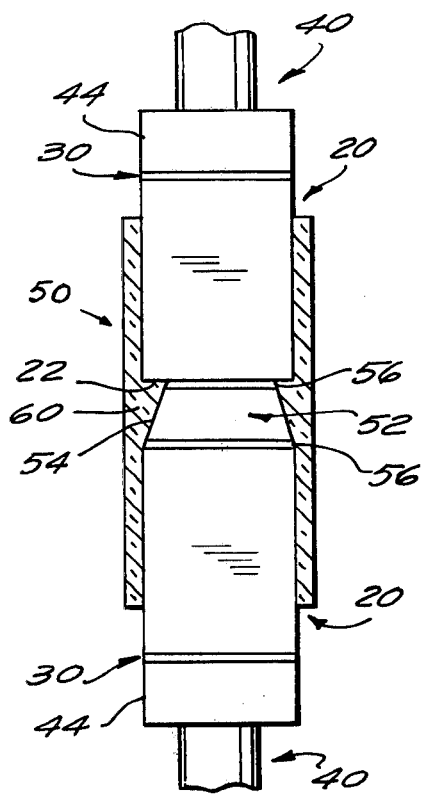
FIG. 3 is a fragmentary plan view of a semiconductor device incorporating the workpiece as a component thereof.

Referring now to the drawing, and in particular to FIG. 2 thereof, therein illustrated is a brazed lead electrode workpiece embodying the principles of the present invention and generally designated by the numeral 10, the individual components thereof being illustrated in exploded view in FIG. 1. Generally speaking, the workpiece 10 comprises an axially extending contact member generally designated by the numeral 20, a brazing alloy generally designated by the numeral 30, and a lead member generally designated by the numral 40. The workpiece 10 is adopted for use as a component of a semiconductor device or subassembly 50 including a semiconductor body 52, as illustrated in FIG. 3.

More specifically, the axially extending contact member 20, generally referred to as a "slug", includes joining surface 22 and 24 at opposite ends thereof. The contact member 20 is formed substantially of a refractory metal material and is preferably composed substantially of molybdenum. tungsten, tantalum and alloys thereof. Whether the alloys be composed of two or more of the aforementioned refractory metals or of one or more of the refractory metals with other materials, the alloys must, of course, be selected according to their known coefficients of expansion to insure that the coefficients of expansion of the semiconductor body 52, the contact member 20 and any materials used to passivate the semiconductor body 52 are compatible.

The brazing alloy preform 30 is of relatively planar configuration and has opposed joining surfaces 32 and 34 at opposite ends thereof. The brazing alloy is a copper/silver-based alloy having a wetting point of at least 450° C. The alloy may include, on a weight basis, up to 25% of metals other than copper and silver—for example, nickel, tin, phosphorus, etc.—so long as it is devoid of any high vapor pressure metals (such as zinc or cadmium) which might adversely affect the semiconductor body 52 to which the workpiece 10 will ultimately be secured. Any available copper/silver-based brazing alloy having a wetting point of at least 450° C may be used provided that the alloy is capable of effectively wetting and bonding with both the refractory metal of contact member 20 and the conductive metal of lead member 40.

A preferred brazing alloy comprises on a weight basis about 80–89% copper, about 5–15% silver, and about 4–6% phosphorus, and may be a commercially available 80/15/5/ high temperature brazing alloy marketed by Englehard Industries Division of Englehard Minerals and Chemicals Corp. (Murray Hill, New Jersey) under the trademark "Silvaloy 15" and by Handy and Harmon, Inc. under the trademark "Silfos". This brazing alloy is characterized by a freezing point of about 640° C and a wetting point of about 705° C. Because the phosphorus acts as a flux, it requires neither an oxidizing nor a reducing environment externally maintained during the brazing process. In this brazing alloy composition, the copper (melting point 1083° C) constitutes the main brazing component, with the silver (melting point 960° C) and the phosphorus (melting point 44° C) lowering the wetting point of the composition to a desirable temperature, and the phosphorus also providing the necessary fluxing action to enable brazing in an inert atmosphere.

Other preferred brazing alloys include the 56–72/-28–42 copper/silver-based alloys such as a 72/28 Ag/Cu eutectic commercially known as "BT braze" (available from Handy and Harmon, Inc. under the tradename "720 ALLOY"), a 71.5/28/0.5 Ag/Cu/Ni alloy ("715 ALLOY"), a 60/30/10 Ag/Cu/Sn alloy ("603 ALLOY"), a 56/42/2 Ag/Cu/Ni alloy ("559 ALLOY"), etc. These brazing alloys are characterized by a freezing point of about 620°–765° C and a wetting point of about 620°–850° C. As they contain no flux, these brazing alloys require a slightly reducing environment externally maintained during the brazing process (such as is conventionally provided by the presence of hydrogen gas). Accordingly, these brazing alloys preferably used only when the lead members 40 are composed of materials which are not particularly subject to hydrogen embrittlement — e.g., oxygen-free copper.

The nail-headed axial lead member 40 has a joining surface 42 on the exposed surface of the head 44 thereof, the tail or other end being available for connection to other circuitry members. The lead member 40 is formed of a thermally and electrically conductive metal such as copper, silver, or alloys thereof, the alloys of such metals by themselves or individually with other materials being selected for their ability to braze well with the brazing alloy of the preform 30. While it is preferred that the conductive metal of joining surface 42 be formed substantially of the aforementioned copper, silver or alloys thereof, a core or sheath is frequently used in connection with the contact member 40 to facilitate its functioning as a heat sink for the semiconductor body 52, to reduce the cost of the materials used in the lead member 40, and/or to provide magnetic susceptibility for lead member 40. Suitable materials for the lead member thus include oxygen-free copper (especially suited for use in a reducing atmosphere), zirconium copper (for a stiffer lead) and copper clad iron (for economy).

The lead member 40 may be joined to the contact member 20 by placing the joining surface 42 of the lead member 40 and the joining surface 24 of the contact member 20 in contact with the joining surfaces 34 and 32, respectively, of the preform 30. To facilitate this operation the various joining surfaces 24, 32, 34, 42 are preferably of the same size and configuration. If desired, the lead member joining surface 42 may be greater in cross-section than the contact member joining surface 24. The preform 30 is then rapidly heated (for about 15 minutes) at least to its wetting point, held at that temperature for a period of time sufficient to melt the alloy (generally about 5 minutes) and thereafter the molten alloy of the preform 30 is allowed to cool and solidify in contact with the joining surfaces 24, 42 of the contact member 20 and lead member 40, thereby joining the members 20, 40 into a unitary structure. Where the brazing alloy 30 contains a flux, this brazing operation may be performed under atmospheric conditions — i.e., in a reducing, inert, or oxidizing enfironment; otherwise a slightly reducing atmosphere is required.

In a preferred embodiment of the process, the components of the workpiece are assembled in a subassembly, as indicated in FIG. 2, with the joining surface 24 of the contact member 20 contact the joining surface 32 of the preform 30, and the other joining surface 34 of the preform 30 contacting the joining surface 42 of the lead member 40. A brazing fixture or jig of graphite, stainless steel or other conventional material is suitable employed to hold the components of the subassembly in proper orientation during passage through the furnace. The entire subassembly is then placed on a conveyor belt which carries it through a tunnel furnace which, if desired, may be provided with an inert atmosphere (such as dry nitrogen) at one atmosphere pressure. The maximum temperature within the tunnel furnace must be sufficient to wet or melt the brazing preform 30, and is preferably about 10°–15° C higher. Generally a dwell time of about 15–20 minutes within the tunnel furnace is sufficient to cause brazing of the lead member 40 to the contact member 20. Preferably the entire subassembly 10 is heated over a 15 minute entry period to at least the wetting point of the brazing alloy, held there for about 5 minutes, and then slowly cooled over a 15 minute period to below the wetting point of the brazing alloy. The work piece may then be further cooled and is then ready for sale or incorporation into a semiconductor device.

The process results in the workpiece components being integrated into a unitary structure having brazed joints which withstand higher temperatures than soft solder joints, are stronger and less porous than butt welded joints, and withstand thermal cycling to high temperatures and high humidity conditions (such as 85° and 85% relative humidity) without failure or the development of high electrical and thermal resistances. The solidity and strength of the brazed joints thus formed permit the workpiece 10 to be further processed without resultant damage thereto.

Referring now to FIG. 3, therein illustrated is a semiconductor device subassembly generally designated by the numeral 50 and incorporating therein a pair of workpieces 10. The semiconductor generally designated by the numeral 52 comprises a diffused silicon chip 54 and, at each end thereof, a layer of evaporated aluminum 56 forming a joining surface for the semiconductor 52. The semiconductor body 54 is formed substantially of silicon, although one or more portions thereof may have minute quantities of various conventional dopants such as phosphorus, boron and the like, as will be well recognized by those skilled in the semiconductor art. For clarity of illustration the semiconductor 52 has been illustrated as a rectifier adapted for connection to only two lead members, although the workpieces 10 of the present invention may be attached to any other semiconductors, such as the N-type, P-type, or combination type and those useful as junction, field effect, or other types of semiconductors. The workpiece 10 of the present invention may be used regardless of whether the semiconductor device comprises a single thin wafer-like diode (as shown) or a relatively long stack of several chips joined in series and brazed together with conventional materials (such as aluminum), with each of the various chips having a plurality of workpieces and/or other leads extending therefrom. The aluminum joining surfaces 56 may be applied to the silicon body 54 by conventional techniques well known in the semiconductor art, the preferred technique being an evaporation deposition technique.

Each workpiece 10 is easily incorporated in the semiconductor device 50 as follows: The refractory contact member 20 is joined to the semiconductor chip 52 by placing refractory joining surface 22 against aluminum joining surface 56 and conventionally brazing the aluminum joining surface 56 to both of the surfaces 52 and 22, to form a refractory metal/aluminum/silicon brazed joint. The aluminum and silicon form a "hard contact" eutectic having a melting point of about 575° C which joins extremely well with both the silicon body 54 and the refractory metal joining surface 22. Due to the nature of the aluminum and silicon materials involved, it is essential that this joint be formed by brazing in an inert atmosphere (i.e., one that is neither an oxidizing nor a reducing atmosphere), and is typically performed in a controlled environment of one atmosphere, or slightly higher, of dry nitrogen, argon, or a similar inert gas.

Thereafter, the exposed surface of the semiconductor body 54 is preferably etched to remove contaminants (e.g., with a solution of nitric and hydrofluoric acids), and a layer of passivating material 60 applied thereto to prevent recontamination. The passivating material 60 is applied over the exposed surface of semiconductor body 54 and a portion of the contact member 20 between the joining surfaces 22, 24 thereof to completely encapsulate the semiconductor device 52 and protect it from exposure to contamination. The passivating material 60 is typically plastic or glass which has been finely ground into a slurry, applied by a conventional technique onto the exposed surface of the semiconductor body 54, and finally heated in situ to a temperature sufficient to fuse the passivating material 60. For example, a tunnel furnace may be maintained at a temperature of about 685° C to about 700° to fuse a glass passivating material 60 applied to the semiconductor device 52. Both the preform 30 and the eutectic at the joints may become fluid again at the temperatures in the tunnel furnace; however, the surface tensions of the brazed joints formed in the brazing processes are sufficient to maintain the molten joints until cooling reoccurs as the subassembly leaves the tunnel furnace.

Because the passivating material 60, the semiconductor body 54 and the refractory member all exhibit compatible coefficients of expansion, the passivated semiconductor devices incorporating workpieces 10 of the present invention exhibit a desirably long life under repeated thermal cycling.

It will be noted that brazed lead electrode or workpiece of the present invention may be produced on standard industrial equipment and does not require the use of the proprietary information or proprietary equipment involved in butt or percussion welding. Furthermore, the process lends itself well to the production of workpieces in mass production quantities as the refractory metal contacts require neither insertion into nor retention by individual welding electrode clamps. As the joint between the axial lead and the refractory metal contact is not formed while one of the parts is in motion, there are no minimum or maximum length or cross-sectional area requirements for either the axial lead or the refractory metal contact. Indeed, according to the present process, the joining end of the axial lead may be larger in cross-section than the joining end of the refractory metal contact, so that the entire joining end of the refractory metal contact member contacts the joining end of the wire lead, thus providing both greater strength for the joint and better conduction between the members thereof. The absence of a maximum cross-sectional area specification for the wire lead, relative to a given refractory metal contact, permits the use of axial leads of a given diameter despite progressive miniaturization of the refractory metal contact. Finally the brazed lead electrode of the present invention is more reliable than a comparable butt or percussion welded joint electrode because its lack of porosity and its generally larger joint cross-section provide a joint of greater strength and thus a joint which is better able to resist the physical processes encountered during incorporation of the brazed lead electrode into the ultimate semiconductor device. Most importantly, semiconductor devices incorporating the brazed lead electrode of the present invention are able to withstand high humidity and high temperature conditions with negligible failures as opposed to similar devices incorporating butt or percussion welded lead electrodes, the latter exhibiting significant failure rates under similar conditions.

Now that the preferred embodiments of the present invention have been shown and described, various modifications and improvements thereon will become readily apparent to those skilled in the art. For example, special high temperature metallic compositions such as dumet (a nickel/iron core sheathed in copper) or copper-clad iron may be considered as equivalent to a refractory metal for the purposes of the present invention. As another example, the semiconductor body may be a diffused silicon chip without any aluminum joining surfaces thereon, and the refractory contact may be joined to an exposed surface of the diffused silicon chip using an aluminum preform therebetween. Accordingly, the spirit and scope of the present invention is to be understood as being limited not by the foregoing disclosure, but only by the appended claims.

We claim:
1. A brazed lead electrode workpiece for use in a semiconductor device comprising:
 a. an axially extending contact member formed substantially of Molylidenum and terminating at one end in a joining surface;
 b. a lead member formed substantially of a thermally and electrically conductive metal and terminating at one end in a joining surface; and
 c. a silver/copper-based brazing alloy having a wetting point of at least 450° C brazed with and securing together said joining surfaces of said members, thereby to join said members into a unitary structure.
2. The workpiece of claim 1 wherein the conductive metal is selected from the group consisting of silver and copper and alloys thereof.
3. The workpiece of claim 2 wherein said conductive metal is copper.
4. The workpiece of claim 1 wherein said joining surfaces of said members are of substantially the same configuration and size.
5. The workpiece of claim 1 wherein said lead member joining surface is greater in cross-section than said contact member joining surface.
6. The workpiece of claim 1 wherein said brazing alloy comprises on a weight basis about 80–89% copper, about 15–15% silver and about 4–6% phosphorus.
7. The workpiece of claim 1 wherein; said thermally and electrically conductive metal is selected from the group consisting of silver, copper and alloys thereof; and said brazing alloy comprises on a weight basis about 80–89% copper, about 5–15% silver and about 4–6% phosphorus.

* * * * *

UNITED STATES PATENT AND TRADEMARK OFFICE
CERTIFICATE OF CORRECTION

PATENT NO. : 4,017,266

DATED : April 12, 1977

INVENTOR(S) : Goldberg et al.

It is certified that error appears in the above—identified patent and that said Letters Patent are hereby corrected as shown below:

Claim 1, line 4, delete "Molylidenum" and insert -- molybdenum --.

Signed and Sealed this twenty-sixth Day of July 1977

[SEAL]

Attest:

RUTH C. MASON
*Attesting Officer*

C. MARSHALL DANN
*Commissioner of Patents and Trademarks*